US005083311A

United States Patent [19]

Kasai et al.

[11] Patent Number: 5,083,311

[45] Date of Patent: Jan. 21, 1992

[54] SOUND FIELD PRODUCING APPARATUS

[75] Inventors: Junichi Kasai; Hiroshi Imai; Tatuyoshi Nanbu, all of Kanagawa, Japan

[73] Assignee: Nissan Motor Company, Limited, Yokohama, Japan

[21] Appl. No.: 915,114

[22] Filed: Oct. 3, 1986

[30] Foreign Application Priority Data

Oct. 3, 1985 [JP] Japan ............................... 60-220903

[51] Int. Cl.[5] ............................................. H03G 3/00

[52] U.S. Cl. ....................................... 381/63; 84/630; 84/707

[58] Field of Search .................... 381/63; 84/DIG. 26, 84/630, 707

[56] References Cited

U.S. PATENT DOCUMENTS

| | | | |
|---|---|---|---|
| 4,063,034 | 12/1977 | Peters | 84/DIG. 26 |
| 4,167,651 | 9/1979 | Kempe | 381/63 |
| 4,215,242 | 7/1980 | Gross | 381/63 |
| 4,415,768 | 11/1983 | Carver | 381/1 |
| 4,472,834 | 9/1984 | Yamamuro et al. | 381/63 |
| 4,581,759 | 4/1986 | Yakahashi | 381/63 |
| 4,625,326 | 11/1986 | Kitzen et al. | 381/17 |

OTHER PUBLICATIONS

Chamberlin, Musical Applications of Microprocessors, 1980, p. 460.

*Primary Examiner*—Forester W. Isen
*Attorney, Agent, or Firm*—Foley & Lardner

[57] ABSTRACT

An apparatus for producing an improved sound field in an acoustic space. The apparatus comprises a signal source for producing a source signal. The source signal is applied to a loudspeaker for reproduction thereof. The source signal is also applied to a reverberation circuit. The reverberation circuit includes at least two reverberation signal generators which provide different predetermined time delays to the source signal for converting it to two reverberation signals. At least one phase inverter is connected to invert at least one of the two reverberation signals before the reverberation signals are reproduced.

3 Claims, 3 Drawing Sheets

SOUND FIELD PRODUCING APPARATUS

BACKGROUND OF THE INVENTION

This invention relates to an apparatus for producing a sound field in an acoustic space and, more particularly, to a sound field producing apparatus for converting a source signal to a direct sound mixed with a plurality of reverberation sounds.

Sound field producing apparatus have been used for reproducing a source signal to create a sound field in an acoustic space. It is the current practice to provide an impression of a widen sound field to a listener by superposing a reverberation sound on a direct sound reproduced directly from a source signal. For this purpose, such sound field producing apparatus include a reverberation signal generator circuit which provides a predetermined time delay to the source signal for converting it to a reverberation signal which is reproduced into a reverberation sound. However, the predetermined time delay provided for the reverberation signal generator circuit is normally set at a value suitable for music source reproduction and not suitable for announcement source reproduction. When reproduction is made for an announcement program, the reproduced voice appears on the direct sound and repeats on the reverberation sound in a separate manner, resulting in an unclear voice away from the natural voice. In addition, when a plurality of signals of the same frequency is reproduced to produce sounds at different times, the resulting composite sound has a level with peaks and depths at specified frequencies, resulting in an unclear voice.

SUMMARY OF THE INVENTION

A main object of the invention is to provide an improved sound field producing apparatus which can convert a source signal to a clear composite sound resulting from a direct sound and a plurality of reverberation sounds.

It is another object of the invention to provide a sound field producing apparatus which can reproduce a clear voice approximate to the natural voice.

It is still another object of the invention to provide a sound field producing apparatus which can provide a flatter frequency characteristic to the reproduced sound.

There is provided, in accordance with the invention, an apparatus for producing a sound field in an acoustic space. The apparatus comprises a signal source for producing a source signal, and means coupled to the signal source for reproducing the source signal. The source signal is also applied to at least two reverberation signal generators which provide different predetermined time delays to the source signal for converting the same to two reverberation signals, respectively. At least one phase inverter is connected to invert at least one of the two reverberation signals fed from the reverberation signal generators before the reverberation signals are reproduced.

BRIEF DESCRIPTION OF THE DRAWINGS

The invention will be described in greater detail by reference to the following description taken in connection with the accompanying drawings, in which.

DETAILED DESCRIPTION OF THE PREFERRED EMBODIMENT

Figure 1:
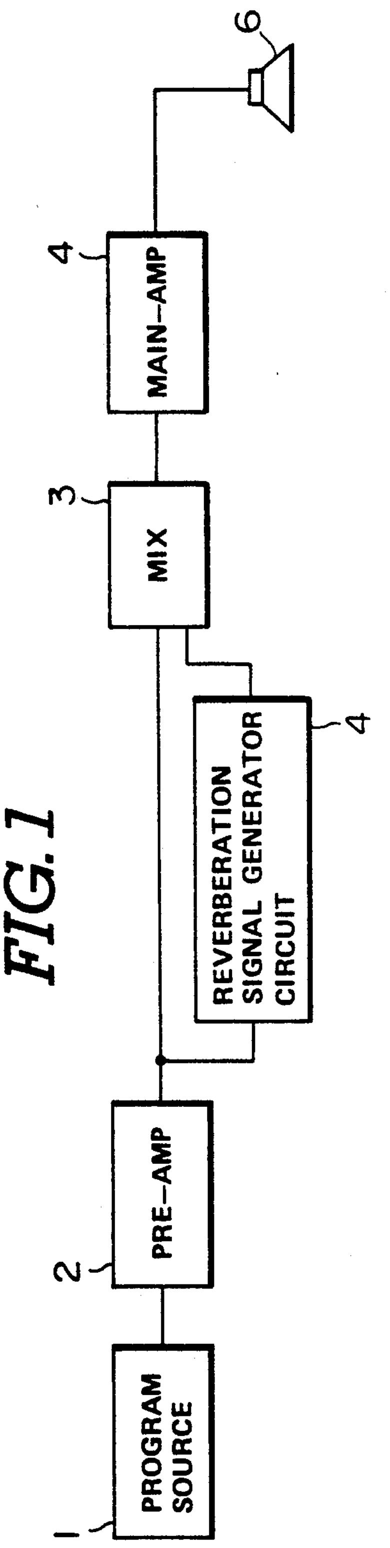
FIG. 1 is a schematic block diagram showing a prior art sound field producing apparatus.

Prior to the description of the preferred embodiment of the invention, the prior art signal reproducing system of FIG. 1 is briefly described in order to provide a basis for a better understanding of the difficulties attendant therewith. Such a prior art system is disclosed in Japanese Patent Kokai No. 58-194095.

Referring to FIG. 1, the system includes a preamplifier circuit 2 which receives a source signal from a program source 1 and amplifies it. The program source 1 may be a cassette tape player, a compact disc player, a tuner, or the like. The amplified signal is applied directly to a mixer circuit 3 and also through a reverberation signal generator circuit 4 to the mixer circuit 3. The reverberation signal generator circuit 4 provides a predetermined time delay to its input signal for converting the amplified signal into a reverberation signal. The output of the mixer circuit 3 is coupled to a main amplifier circuit 5 which drives a loudspeaker 6. Consequently, the loudspeaker 6 produces a composite sound which is a mixture of a direct sound reproduced from the source signal and a reverberation sound reproduced from the reverberation signal. This reverberation sound is effective to provide a widen sound field even in a narrow acoustic space.

In the conventional system, however, the predetermined time delay provided for the reverberation signal generator circuit 4 is set at a value suitable for music source reproduction and not suitable for announcement source reproduction. When reproduction is made for an announcement program in the conventional system, the reproduced voice appears on the direct sound and repeats on the reverberation sound in a separate manner, resulting in an unclear and unnatural voice away from the nature voice.

Figure 2:
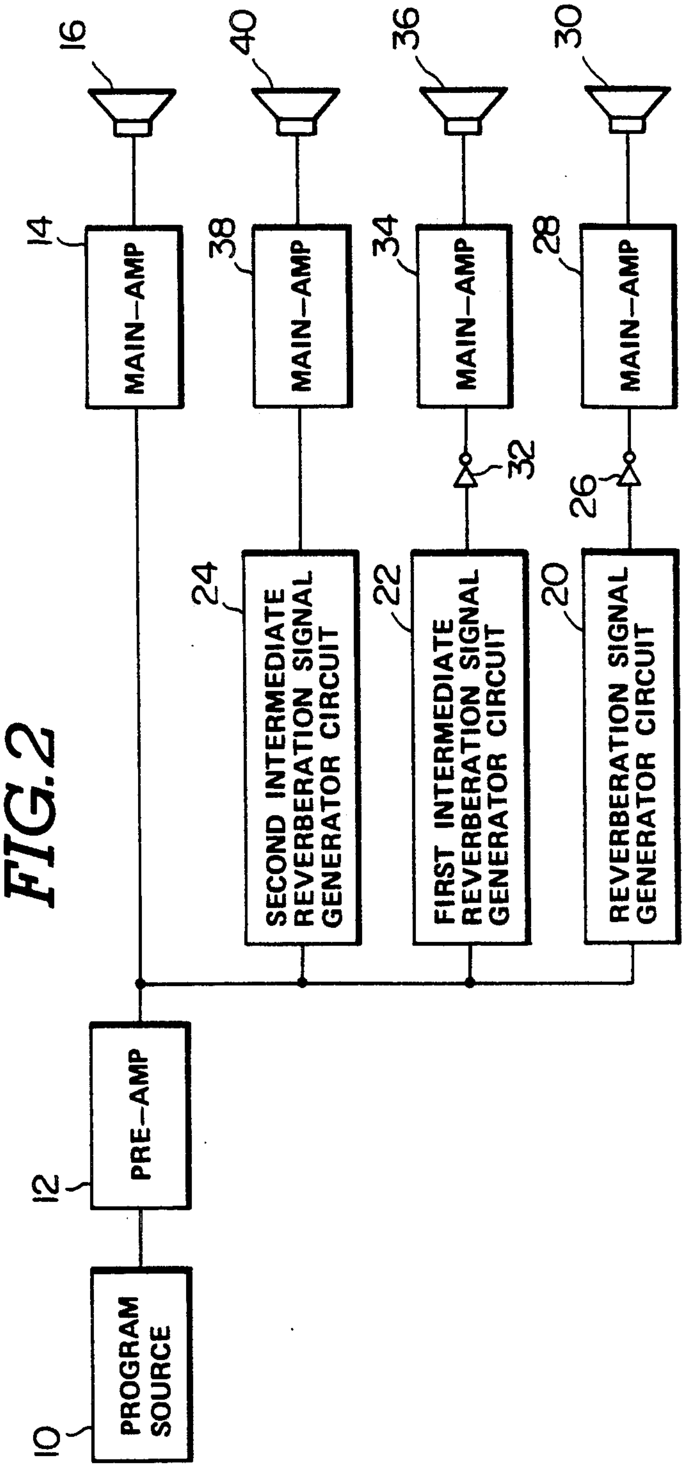
FIG. 2 is a schematic block diagram showing one embodiment of a sound field producing apparatus made in accordance with the invention.

Referring to FIG. 2, there is illustrated one embodiment of a signal reproducing system made in accordance with the invention. The system includes a program source 10 such for example as a cassette tape player, a compact disc player, a tuner, or the like which produces a source signal. The source signal is fed from the program source 10 to a pre-amplifier circuit 12 which amplifies it. The amplified signal is fed through a main amplifier circuit 14 which drives a loudspeaker 16 for producing a direct sound which is reproduced from the source signal. The amplified signal is also fed to a reverberation signal generator circuit 20, a first intermediate reverberation signal generator circuit 22, and a second intermediate reverberation signal generator circuit 24. The reverberation signal generator circuit 20 provides a predetermined time delay $t_1$ (in this case 16 msec) to its input signal for converting the amplified signal into a reverberation signal. The output of the reverberation signal generator circuit 20 is connected through a phase inverter 26 to a main amplifier circuit 28 which drives a loudspeaker 50 for producing a reverberation sound. The first intermediate reverberation signal generator circuit 22 provides a predetermined time delay $t_2$ (in this case 8 msec) to its input signal for converting the amplified signal into a first intermediate reverberation signal, the predetermined time delay $t_2$ being one-half of the predetermined time delay $t_1$. The output of the first intermediate reverberation signal generator circuit 22 is connected through a phase inverter 32 to an main amplifier circuit 34 which drives a loudspeaker 36 for producing a first intermediate reverberation sound. The second intermediate reverberation signal generator circuit 24 provides a predetermined time delay $t_3$ (in this case 4 msec) to its input signal for converting the amplified signal into a second intermediate reverberation signal, the predetermined time delay $t_3$ being one-half of the predetermined time delay $t_2$. The output of the second intermediate reverberation signal generator circuit 24 is connected directly to a main amplifier circuit 38 which drives a loudspeaker 40 for producing a second intermediate reverberation sound.

The listener listens a composite sound which is a mixture of a direct sound produced from the loudspeaker 16, a reverberation sound produced from the loudspeaker 30, a first intermediate reverberation sound produced from the loudspeaker 36, and a second intermediate reverberation sound produced from the loudspeaker 40. The first intermediate reverberation signal is delayed a time $t_2$ (8 msec) which is one-half of the delay time $t_1$ (16 msec) provided for the reverberation signal. As a result, the first intermediate reverberation sound produced from the loudspeaker 36 arrives at the listener at a time intermediate between the times of arrival of the direct sound produced from the loudspeaker 16 and the reverberation sound produced from the loudspeaker 30. In addition, the second intermediate reverberation signal is delayed at a time $t_3$ (4 msec) which is one-half of the delay time $t_2$ (8 msec) provided for the first intermediate reverberation signal. As a result, the second reverberation sound produced from the loudspeaker 40 arrives at the listener at a time intermediate between the times of arrival of the direct sound produced from the loudspeaker 16 and the first intermediate reverberation sound produced from the loudspeaker 36. The first and second intermediate reverberation sounds produced from the loudspeakers 36 and 40 are effective to provide acoustic sounds continuous in time between the direct and reverberation sounds so as to suppress a phenomenon such as a voice appears on the direct sound and repeats on the reverberation sound in a separate manner and to produce a clear voice approximate to the nature voice.

Figure 3:
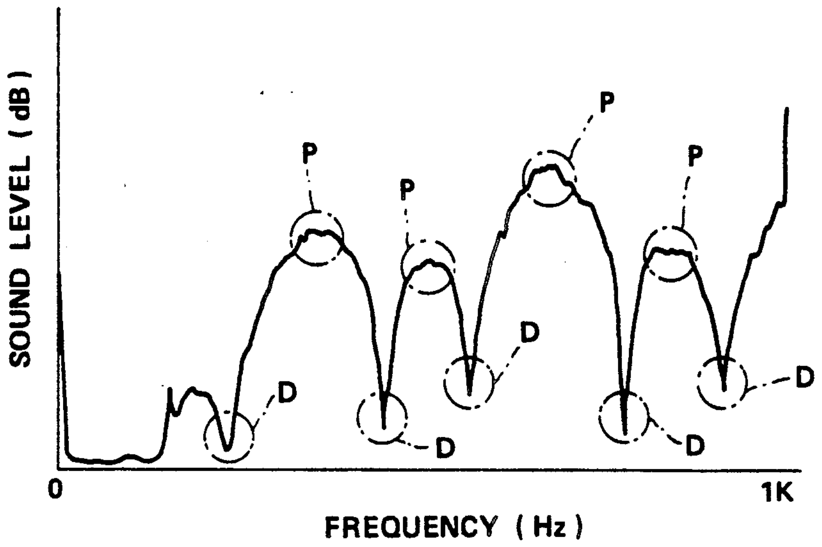
FIGS. 3 and 4 are graphs of reproduced sound level versus frequency used in explaining the operation of the inventive apparatus.
Figure 4:
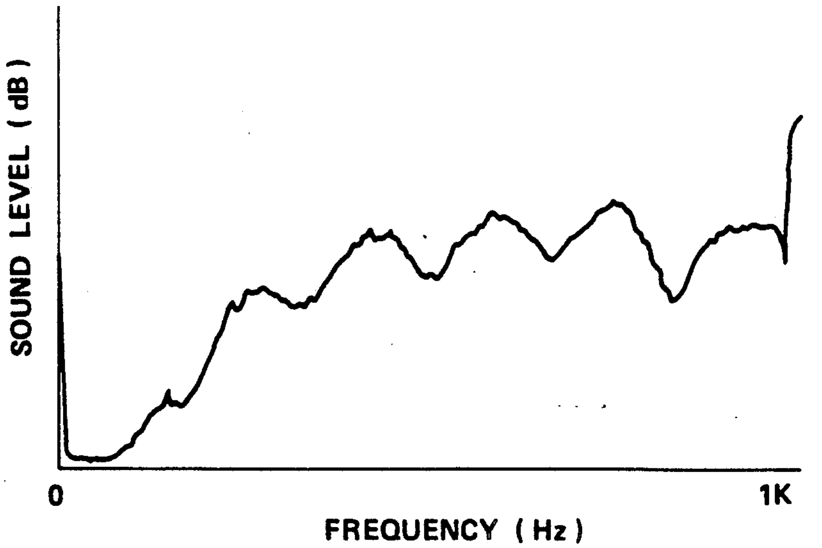

When a plurality of signals of the same frequency is reproduced to produce sounds at different time, the resulting composite sound has a level with peaks and depths if these signals are in phase. For example, a composite sound resulting from the direct sound produced from the loudspeaker 16 and the second intermediate reverberation sound produced from the loudspeaker 40 has a level having peaks P and depths D at specified frequencies, as shown in FIG. 3, due to interference between the direct and intermediate-reverberation sounds. Similarly, a composite sound resulting from the reverberation sound produced from the loudspeaker 30 and the first intermediate reverberation sound produced from the loudspeaker 36 has a level having peaks P and depths D at the specified frequencies due to the interference between the direct and intermediate-reverberation sounds. Since the signals applied to the loudspeakers 30 and 36 are in opposite phase with the signals applied to the loudspeakers 16 and 40 by the function of the inverters 26 and 32, the peaks and depths of the composite sound resulting from the reverberation sound produced from the loudspeaker 30 and the first intermediate reverberation sound produced from the loudspeaker 36 compensate or cancel the peaks and depths of the composite sound resulting from the direct sound produced from the loudspeaker 16 and the second intermedaite reverberation sound produced from the loudspeaker 40, resulting in a flatter frequency characteristic to the eventual composite sound, as shown in FIG. 4.

Figure 5:
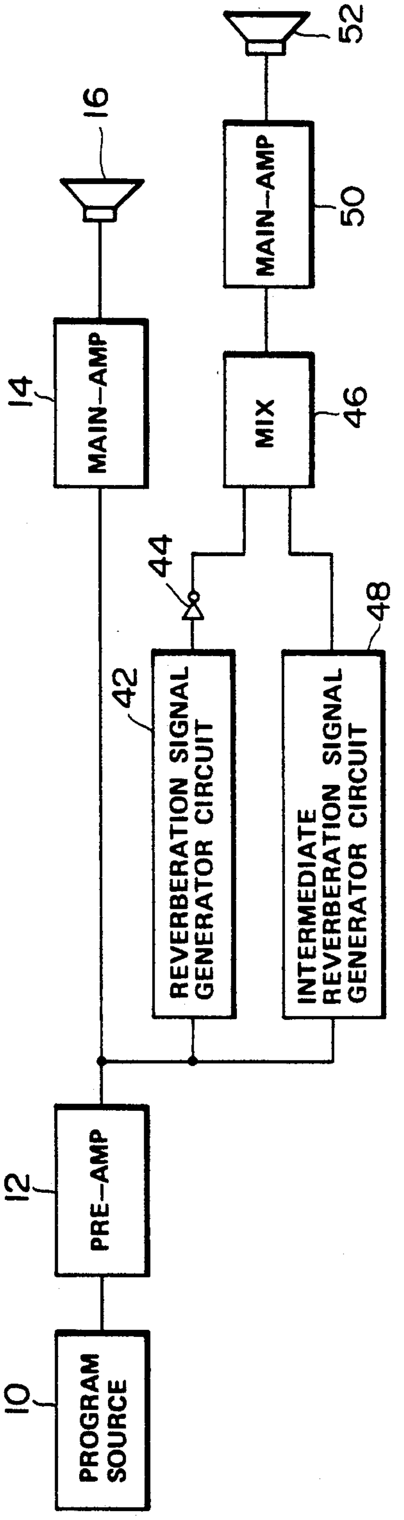
FIG. 5 is a schematic block diagram showing a second embodiment of the invention.

Referring to FIG. 5, a second embodiment of the invention is illustrated with the same components being designated by the same reference numerals. In this embodiment, the amplified signal is applied from the preamplifier circuit 12 to the main amplifier circuit 14 which drives the loudspeaker 16. The amplified signal is also applied through a reverberation circuit to a main amplifier circuit 50 which drives a loudspeaker 52. The reverberation circuit includes a reverberation signal generator circuit 42 which provides a predetermined time delay $t'_1$ (in this case 20 msec) to its input signal for converting the amplified signal into a reverberation signal. The output of the reverberation signal generator circuit 42 is coupled through an inverter 44 to one input of a mixer circuit 46. The reverberation circuit also includes an intermediate reverberation signal generator 48 which provides a predetermined time delay $t'_2$ (in this case about 10 msec) for converting the amplified signal into an intermediate reverberation signal. The time delay $t'_2$ is shorter than the time delay $t'_1$ and preferably about one-half of the time delay $t'_1$. The output of the intermediate reverberation signal generator circuit 48 is coupled to another input of the mixer circuit 46. The output of the mixer circuit 46 is coupled to the main amplifier circuit 50.

The listener listens a composite sound which comprises a direct sound produced from the loudspeaker 16 and a mixture of reverberation and intermediate-reverberation sounds produced from the loudspeaker 52. The intermediate reverberation signal is delayed a time $t'_2$ which is one-half of the delay time $t'_1$ provided for the reverberation signal. As a result, the intermediate reverberation sound arrives at the listener at a time intermediate between the times of arrival of the direct sound produced from the loudspeaker 16 and the reverberation sound produced from the loudspeaker 52. The intermediate reverberation sound produced from the loudspeaker 52 is effective to provide acoustic sounds continuous in time so as to suppress such a phenomenon that a voice appears on the direct sound and repeats on the reverberation sound in a separate manner and to produce a clear voice approximate to the nature voice.

When a plurality of signals of the same frequency is reproduced to produce sounds at different times, the resulting composite sound has a level having peaks P and depths D due to interference between produced sound components if these signals are in phase. Assuming now that the difference $\Delta t'_1$ between the times of production of the direct and reverberation sounds is 20 msec and the difference $\Delta t'_2$ between the times of production of the direct and intermediate-reverberation sounds is 10 msec, the composite sound level has peaks P at frequencies $(n \times 100)$ Hz and depths D at frequencies $(n \times 100 - 50)$ Hz due to the interference between the direct and intermediate-reverberation sounds, where n indicates integers. Similar peaks and depths will appear on the produced composite sound level due to the interference between the direct and reverberation sounds and due to the interference between the reverberation and intermediate-reverberation sounds in a direction degrading the quality of the produced composite sound if the inverter 44 is removed.

The phase inverter 44 inverts the reverberation signal fed thereto from the reverberation signal generator circuit 42. Since the intermediate reverberation signal is delayed a time (10 msec) with respect to the direct signal and the reverberation signal is delayed the same time (10 msec) with respect to the intermediate reverberation signal, and only the reverberation signal is in opposite phase with the other signals, the peaks and depths of the composite sound resulting from the reverberation and intermediate-reverberation sounds produced from the loudspeaker 52 compensate or cancel the peaks and depths of the composite sound resulting from the direct sound produced from the loudspeaker 16 and the intermediate reverberation sound produced from the loudspeaker 52, resulting in a flatter frequency characteristic to the eventual composite sound.

Figure 6:
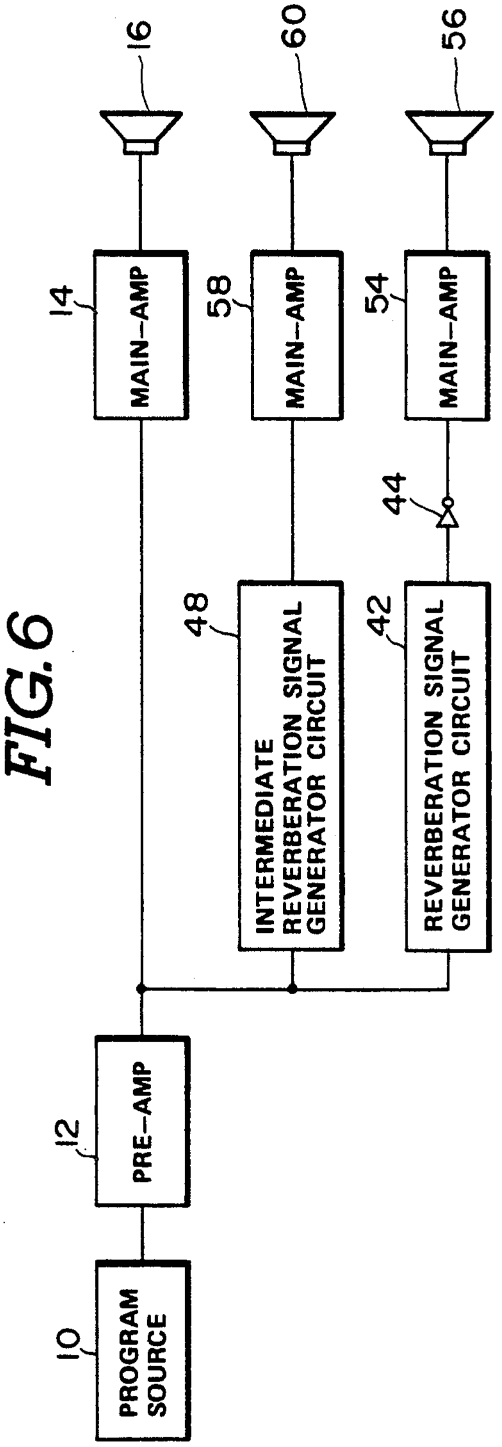
FIG. 6 is a schematic block diagram showing a third embodiment of the invention.

Referring to FIG. 6, there is illustrated a third embodiment of the invention. The main difference of this embodiment from the second embodiment of FIG. 5 is in that the mixer circuit 46 is removed from the reverberation circuit. Like reference numerals have been applied to FIG. 6 with respect to the same components shown in FIG. 5. The output of the reverberation signal generator circuit 42 is connected through the invertor 44 to a main amplifier 54 which drives a loudspeaker 56, whereas the output of the intermediate reverberation signal generator circuit 48 is connected directly to a main amplifier circuit 58 which drives a loudspeaker 60. In this embodiment, the reverberation circuit can provide a flatter frequency characteristic to the eventual composite sound substantially in the same manner as described in connection with the second embodiment. In addition, this arrangement is advantageous over the second embodiment in that there is no interference between the signals outputted from the reverberation and intermediate-reverberation signal generator circuits 42 and 48 which may occur in the mixer circuit 46 of the second embodiment of FIG. 5.

Although two intermediate reverberation signal generation circuits are provided in the first embodiment and one intermediate reverberation signal generator circuit is provided in the second and third embodiments, it will be appreciated that three or more intermediate reverberation signal generator circuits capable of providing different time delays to their respective input signals may be provided to produce successive sounds with less time difference if it is required to approximate the reproduced voice closer to the nature voice. In this case, it is preferable to provide inverters to selected ones of the intermediate reverberation signals, the reverberation signal, and/or the direct signal in such a manner that the peaks and depths of one component sound resulting from two sounds can compensate or cancel the peaks and depths of another composite sound resulting from two sounds produced with the same time difference as provided for the sounds of the one composite sound. In this case, it is preferable to select a combination of two composite sounds each resulting from two sounds produced with less time difference in view of human acoustic sense.

It can be seen from the foregoing that the inventive apparatus can convert a source signal to a clear composite sound resulting from a direct sound and a plurality of reverberation sounds. According to the invention, a plurality of reverberation signal generator circuits are provided to reduce the time difference between two sounds produced in succession so as to suppress a phenomenon such as a voice appears on the direct sound and repeats on the reverberation sound in a separate manner. In addition, at least one inverter is connected to invert at least one of the reverberation signals so as to provide a flatter frequency characteristic to the eventual composite sounds.

What is claimed is:

1. An apparatus for producing a sound field in an acoustic space, comprising:

a signal source for producing a source signal;

means coupled to said signal source for directly reproducing the source signal;

a reverberation circuit including at least two reverberation signal generators coupled to said signal source for providing different predetermined time delays to the source signal for converting the source signal to reverberation signals, said reverberation circuit including a first reverberation signal generator coupled to said signal source for providing a first predetermined time delay to the source signal to convert the source signal to a first reverberation signal, and a second reverberation signal generator coupled to said signal source for providing a second predetermined time delay to the source signal to convert the source signal to a second reverberation signal, the second predetermined time delay being substantially one-half of the first predetermined time delay;

means coupled to said reverberation circuit for reproducing the reverberation signals separately from the source signal; and at least one phase invertor connected to invert at least one of the first and second reverberation signals generated from said first and second reverberation signal generators;

wherein said means for reproducing the reverberation signals includes means for reproducing the reverberation signals independently.

2. An apparatus for producing a sound field in an acoustic space, comprising:

a signal source for producing a source signal;

means coupled to said signal source for directly reproducing the source signal;

a reverberation circuit including a first reverberation signal generator coupled to said signal source for providing a first predetermined time delay to the source signal to convert the source signal to a first reverberation signal, and a second reverberation signal generator coupled to said signal source for providing a second predetermined time delay to the source signal to convert the source signal to a second reverberation signal, the second predetermined time delay being substantially one-half of the first predetermined time delay, and a third reverberation signal generator coupled to the signal source for providing a third predetermined time delay to the source signal to convert the source signal to a third reverberation signal, the third predetermined time delay being substantially one-half of the second predetermined time delay;

means coupled to said reverberation circuit for reproducing the reverberation signals separately from the source signal; and a first phase inverter connected to invert the first reverberation signal generated from the first reverberation signal generator; and a second phase inverter connected to invert the second reverberation signal generated from the second reverberation signal generator.

3. The apparatus as claimed in claim 2, wherein the first predetermined time delay is 16 milliseconds, the second predetermined time delay is 8 milliseconds, and the third predetermined time delay is 4 milliseconds.

* * * * *